United States Patent
Sezi

(10) Patent No.: US 6,884,567 B2
(45) Date of Patent: *Apr. 26, 2005

(54) PHOTOSENSITIVE FORMULATION FOR BUFFER COATINGS, FILM CONTAINING THE PHOTOSENSITIVE FORMULATION, AND METHOD FOR FABRICATING ELECTRONICS WITH THE PHOTOSENSITIVE FORMULATION

(75) Inventor: Recai Sezi, Roettenbach (DE)

(73) Assignee: Infineon Technologies AG, Munich (DE)

( * ) Notice: Subject to any disclaimer, the term of this patent is extended or adjusted under 35 U.S.C. 154(b) by 223 days.

This patent is subject to a terminal disclaimer.

(21) Appl. No.: 10/244,257

(22) Filed: Sep. 16, 2002

(65) Prior Publication Data

US 2003/0099904 A1 May 29, 2003

(30) Foreign Application Priority Data

Sep. 14, 2001 (DE) .......................................... 101 45 471

(51) Int. Cl.$^7$ ............................................... G03F 7/004
(52) U.S. Cl. ............................... 430/283.1; 430/286.1; 430/287.1; 430/311
(58) Field of Search ............................. 430/283.1, 311, 430/287.1, 286.1

(56) References Cited

U.S. PATENT DOCUMENTS

| | | | | |
|---|---|---|---|---|
| 4,339,521 A | * | 7/1982 | Ahne et al. | 430/192 |
| 4,622,285 A | * | 11/1986 | Ahne | 430/322 |
| 4,849,051 A | * | 7/1989 | Ahne et al. | 216/48 |
| 5,021,320 A | * | 6/1991 | Mueller et al. | 430/192 |
| 5,037,720 A | * | 8/1991 | Khanna | 430/190 |
| 5,077,378 A | | 12/1991 | Mueller et al. | |
| 5,096,999 A | * | 3/1992 | Hellmut et al. | 528/182 |
| 5,106,720 A | | 4/1992 | Mueller et al. | |
| 5,240,819 A | | 8/1993 | Mueller et al. | |
| 5,922,825 A | * | 7/1999 | Sezi et al. | 528/191 |
| 5,973,202 A | * | 10/1999 | Sezi et al. | 564/134 |
| 6,437,178 B1 | * | 8/2002 | Sezi et al. | 562/433 |

FOREIGN PATENT DOCUMENTS

| | | | |
|---|---|---|---|
| EP | 0 264 678 B1 | 4/1988 | |
| JP | 10204291 A * | 8/1998 | ........... C08L/79/08 |
| JP | 11202489 A * | 7/1999 | ........... G03F/7/039 |
| JP | 2001049119 A * | 2/2001 | ........... C08L/79/08 |
| JP | 2001-194791 | 7/2001 | |

OTHER PUBLICATIONS

English language abstract of JP 11–202489.*
English language abstract of JP2001–049119.*
English language abstract of JP 10–204291.*

* cited by examiner

*Primary Examiner*—Amanda Walke
(74) *Attorney, Agent, or Firm*—Laurence A. Greenberg; Werner H. Stemer; Ralph E. Locher

(57) ABSTRACT

A photosensitive formulation for high-temperature-resistant photoresists is based on polyhydroxyamides. The photosensitive formulations display a much higher photosensitivity than the comparable formulations based on quinone azide photoactive components. After conversion to the polybenzoxazole, the novel formulations also display a lower dielectric constant than the quinone azide-based formulations. A film can be made by applying the photosensitive formulation to a wafer and then evaporating the solvent. A method for fabricating electronics and micorelectronics structures a wafer by using the film in photolithography.

18 Claims, No Drawings

PHOTOSENSITIVE FORMULATION FOR BUFFER COATINGS, FILM CONTAINING THE PHOTOSENSITIVE FORMULATION, AND METHOD FOR FABRICATING ELECTRONICS WITH THE PHOTOSENSITIVE FORMULATION

BACKGROUND OF THE INVENTION

Field of the Invention

The invention relates to a photosensitive formulation for high-temperature-resistant photoresists based on polyhydroxyamides, films containing photosensitive formulations, and methods for fabricating electronics with the photosensitive formulations.

Polybenzoxazoles, which are stable at high temperatures, are used in microelectronics as dielectrics or buffer coatings. The precursors of these polybenzoxazoles, known as poly-o-hydroxyamides, may also be made photoreactive by mixing appropriate photoactive components into the formulation of these dielectrics. The precursors are converted into polybenzoxazole by heat treatment (i.e. baking) at temperatures above 250° C.

The following schematically depicts the mechanism of the cyclization of poly-o-hydroxyamides to polybenzoxazoles:

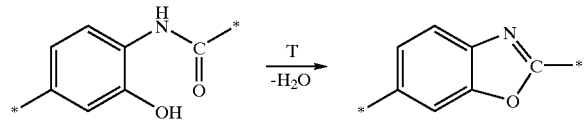

On heating, the o-hydroxyamide undergoes cyclization with elimination of water to yield the oxazole.

In comparison to the photosensitive polyimides, for example, photosensitive poly-o-hydroxyamides have the advantage that they can be positively structured and can be developed by aqueous alkali. Moreover, after baking, they have higher temperature stabilities and lower dielectric constants.

As well as the thermal and mechanical stability, the dielectric constant of these materials is an important criterion for their use. It must be as low as possible in order that the electrical insulating effect, between conductor tracks or conductor track planes, for example, is good and the electrical performance of the microelectronic component is enhanced.

The sensitivity of the photosensitive formulation is a decisive factor for production. Where the photo-sensitive dielectric requires high exposure energies (in the case of low sensitivity), the throughput in production is low and the overall costs are correspondingly high. For this reason, the aim is for as high as possible a sensitivity of the photosensitive material.

The existing photosensitive polybenzoxazole precursors (e.g., photosensitive poly-o-hydroxyamides) display sensitivities lower than those of photosensitive polyimides.

European Patent No. EP 0 264 678 B1, which corresponds to U.S. Pat. Nos. 5,240,819, 5,106,720, and 5,077,378, discloses photosensitive formulations that include a poly-o-hydroxyamide as their polymer base and a o-quinone diazide as their photoactive component (dissolution inhibitor). However, the sensitivity of the formulations described therein is still too low for production. Moreover, the addition of o-quinone diazide causes these formulations to exhibit high dielectric constants.

SUMMARY OF THE INVENTION

It is accordingly an object of the invention to provide a photosensitive formulation for buffer coatings, a film containing the photosensitive formulation, and a method for fabricating electronics with the photosensitive formulation that overcome the hereinafore-mentioned disadvantages of the heretofore-known devices of this general type and that provide novel photosensitive dielectrics and/or buffer layers based on poly-o-hydroxyamides, combining a low dielectric constant with a much improved sensitivity.

The invention achieves the object by providing a photosensitive formulation having the following features. The formulation includes a poly-o-hydroxyamide, a dissolution inhibitor, a photoacid, and a solvent. The poly-o-hydroxyamide contains free hydroxyl groups. A dissolution inhibitor contains polar groups blocked with acid-labile groups, so that the dissolution inhibitor is insoluble in polar solvents. In addition, following elimination of the acid-labile groups, the polar groups are liberated and the dissolution inhibitor is soluble in polar solvents.

Poly-o-hydroxyamides are polymers that are obtained by condensing bis-o-aminophenols with dicarboxylic acids, which may where appropriate have been activated. The terminal groups of the polymer may be blocked by corresponding monovalent groups. Bis-o-aminophenols are compounds that include two pairs of hydroxyl groups and amino groups attached to phenyl rings and positioned ortho to one another. The pairs, which are formed in each case from one hydroxyl group and one amino group, can be sited on different phenyl rings or in the same phenyl ring.

The nature of the dissolution inhibitor is to change its polarity on exposure to acid and to become soluble in polar developers, especially aqueous-alkaline developers. To this end, the dissolution inhibitor may, for example, include polar groups, protected by an acid-labile group. Suitable polar groups are, for example, a carboxyl group or a hydroxyl group. Suitable acid-labile groups are, for example, tert-alkyl groups, tert-alkyloxycarbonyl groups, tetrahydrofuranyl, or tetrahydropyranyl groups. The acid-labile group is preferably a tert-butyl group or a tert-butoxycarbonyl group (t-BOC). Suitable dissolution inhibitors of this kind include low-molecular-mass compounds, and also polymers, which contain the acid-labile groups, attached to polar groups, as pendant groups. However, the dissolution inhibitor can be an apolar polymer whose chain contains an acid-cleavable group, such as a polyester or a polycarbonate. The polymer is cleaved on exposure to acid, producing short fragments with polar groups that are soluble in polar developers.

The dissolution inhibitor, therefore, is first of all apolar and insoluble in polar developers, especially aqueous-alkaline developers. Elimination of the acid-labile groups liberates polar groups, which increases the polarity of the dissolution inhibitor or of the fragments resulting from the dissolution inhibitor and so increases its solubility in polar developers, especially aqueous-alkaline developers.

Using the formulation of the invention, a film is first produced on a substrate, such as a wafer. After the solvent has evaporated, a solid film is obtained which is insoluble in polar, preferably aqueous-alkaline, developers. Although the poly-o-hydroxyamide present in the photosensitive formulation of the invention is soluble in polar developers, the dissolution inhibitor reduces the polarity of the solid film to such an extent that the poly-o-hydroxyamide is held within the solid film. The solid film is then sectionally exposed to light of an appropriate wavelength. This can be done, for example, by introducing a mask between light source and solid film in the beam path, so that exposed and unexposed sections are obtained in the solid film. In the exposed sections, the photoacid liberates a strong acid that eliminates the acid-labile groups on the dissolution inhibitor. In order to accelerate the elimination, the wafer with the exposed film can also be heated. In the exposed areas, there is a resulting increase in the polarity of the dissolution inhibitor, which thus becomes soluble in polar developers, especially aqueous-alkaline developers. As a result, the exposed sections can be detached from the wafer using an alkaline developer, while the unexposed sections remain on the wafer surface. Via heat treatment, the poly-o-hydroxyamide can be converted into the polybenzoxazole.

The dielectrics obtained from the formulation of the invention feature a lower dielectric constant and hence a better insulation effect than dielectrics such as those described, for example, in European Patent No. EP 0 264 678, which corresponds to U.S. Pat. Nos. 5,240,819, 5,106, 720, and 5,077,378. The dielectrics possess a high thermal stability and the solid film produced from the formulation possesses a transparency that is sufficient for structuring (patterning) even at short wavelengths.

With particular preference the formulation includes a poly-o-hydroxyamide of the general Formula I:

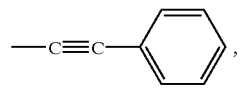

where n=0 to 10; and if $A^2$ is attached to —CO— and/or c=0, $A^2$ is an OH group; $X^1$ and $X^2$, independently of one another, are:

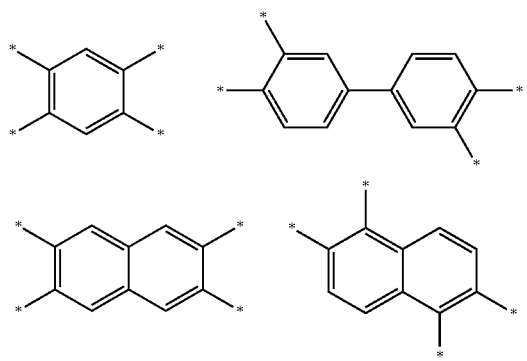

Formula I

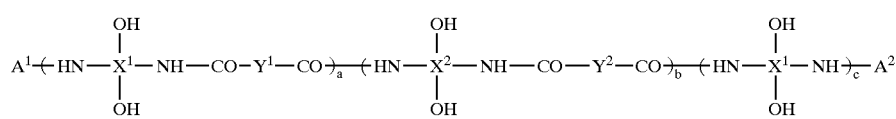

where
$A^1$ and $A^2$ (attached to —NH—) are identical or different and are selected from the following group of substituents:
—H, —CO—(CH$_2$)$_n$—CH$_3$, —CO—(CF$_2$)$_n$—CF$_3$, —CO—CH=CH—COOH, where n=0 to 10;

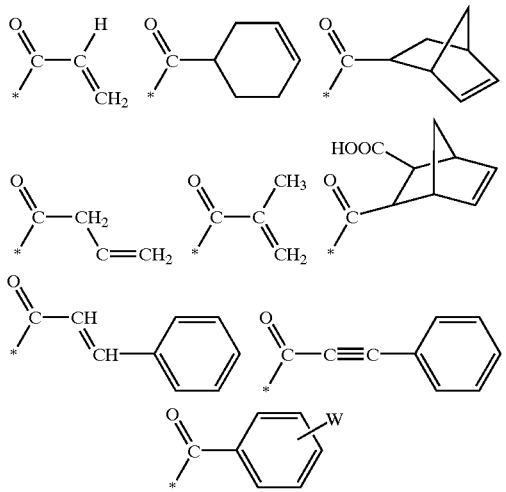

where W=—H, —F, —CN, —C(CH$_3$)$_3$, —(CH$_2$)$_n$—CH$_3$, —(CF$_2$)$_n$—CF$_3$, —O—(CH$_2$)$_n$—CH$_3$, —O—(CF$_2$)$_n$—CF$_3$, —CH=CH$_2$, —C≡CH, or -continued

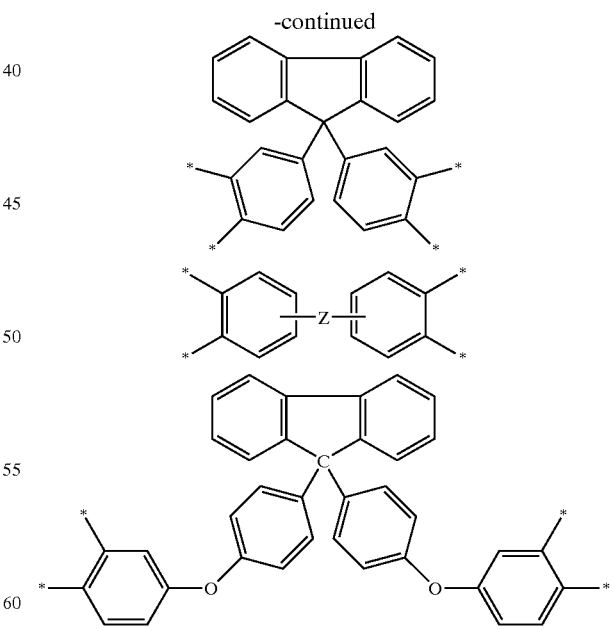

Z is selected from the group of the following substituents:
—O—, —CO—, —S—, —S—S—, —SO$_2$—, —(CH$_2$)$_m$—, —(CF$_2$)$_m$— where m=1 to 10; —C(CR$^6{}_3$)$_2$— where R$^6$ is the same or different and can be a hydrocarbon radical having 1 or 2 carbon atoms, which may also be fully or partly fluorinated, hydrogen, halide or pseudohalide;

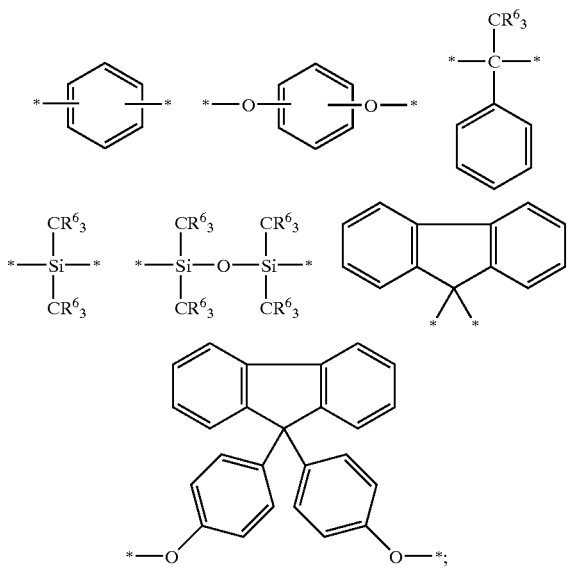

—Y¹ and Y², independently of one another, are:

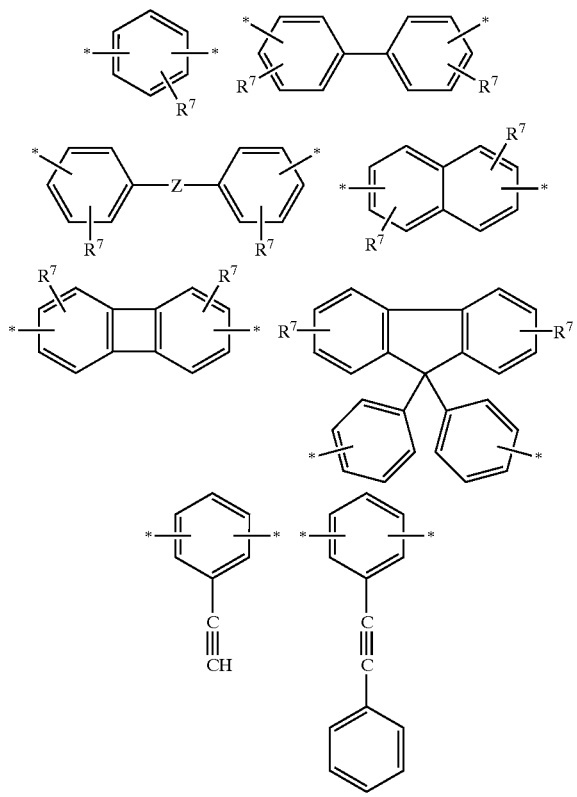

where $R^7$ can be:

—H, —CN, —C(CH$_3$)$_3$, —C(CF$_3$)$_3$, —(CH$_2$)$_n$—CH$_3$, —(CF$_2$)$_n$—CF$_3$, —O—(CH$_2$)$_n$—CH$_3$, —O—(CF$_2$)$_n$—CF$_3$, —C≡CH, —CH═CH$_2$, —O—CH═CH$_2$, —O—CH$_2$—CH═CH$_2$, —CO—(CH$_2$)$_n$—CH$_3$, —CO—(CF$_2$)$_n$—CF$_3$, where n=0 to 10; and Z is as defined above;
finally, a can adopt any value from 1 to 100; b any value from 0 to 100; and c the value 0 or 1.

During the preparation of the poly-o-hydroxyamide of the Formula I, not all polymer molecules have the same chain length, but instead, a molecular weight distribution is obtained. The values of the indices a, b, and c are therefore to be understood in such a way that the maximum of the molecular weight distribution is situated within the stated ranges. The molecular weight distribution can be determined by customary techniques, an example being gel permeation chromatography.

In order to allow cyclization to the benzoxazole, each of the bonds arranged ortho to one another on a phenyl ring of the group Z leads to an —OH and to an —NH group that is part of an amide group.

Preferably, the formulation also includes a sensitizer that is free from o-quinone diazide and/or o-naphthoquinone diazide.

The sensitizer raises the quantum yield in the liberation of the acid from the photoacid, so that the formulation of the invention has a greater sensitivity with respect to the exposing radiation used.

Preferably, the formulation may include at least one photobase and/or adhesion promoters, defoamers, and/or surface-active substance(s). The photobase allows the photosensitivity of the formulation to be adjusted.

Particularly suitable photoacids are sulfonium salts and iodonium salts, and also sulfonate derivatives of succinimide, phthalimide, and naphthalimide, and also diazodisulfone derivatives.

Particularly suitable photoacids are the following compounds:

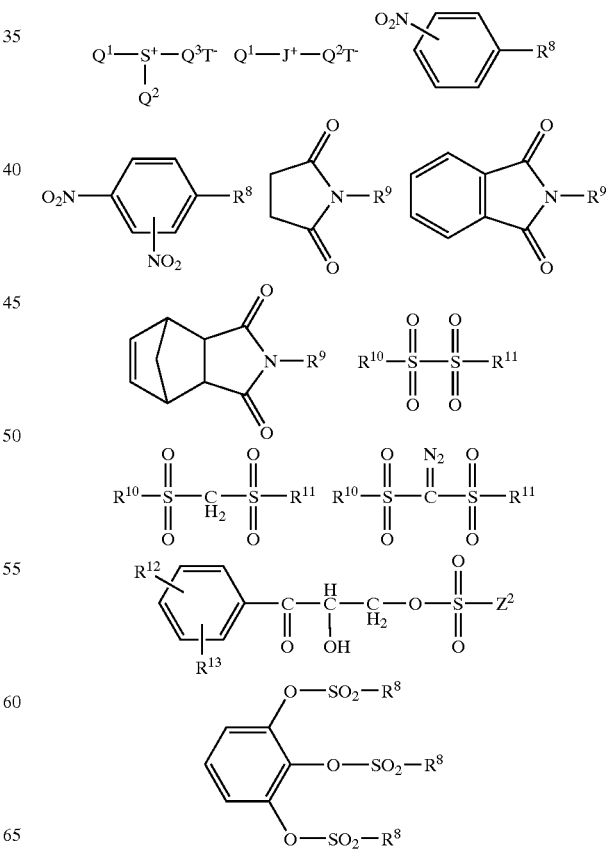

J denotes iodine;

$Q^1$, $Q^2$ and $Q^3$ independently of one another denote —CH$_3$, —OCH$_3$, —CF$_3$, —OCF$_3$; and also

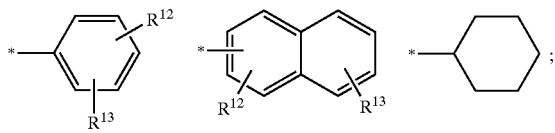

T denotes F$_3$C—(CF$_2$)$_n$—SO$_3$, H$_3$C—(CH$_2$)$_n$—SO$_3$, SbF$_6$, AsF$_6$, BF$_4$, PF$_6$ (where n=0 to 10); and also

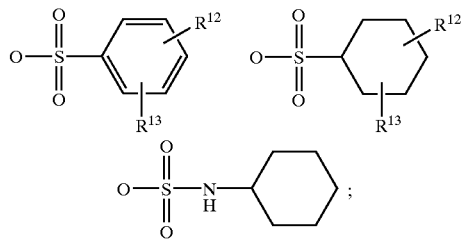

$R^8$ denotes

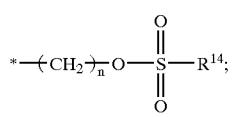

$R^9$ denotes the radicals stated for $R^8$ or

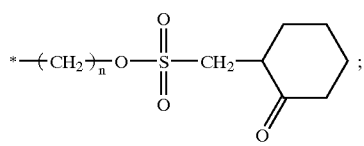

$R^{10}$ and $R^{11}$ independently of one another denote

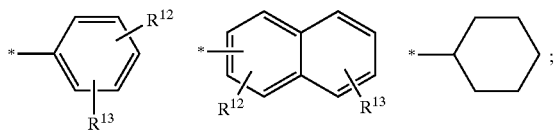

$R^{12}$ and $R^{13}$ independently of one another denote —H, —F, —Cl, —CH$_3$, —OCH$_3$, —SCH$_3$, —CF$_3$, —OCF$_3$, —OSF$_3$, —OH, —C(CH$_3$)$_3$, —C(CF$_3$)$_3$, and also

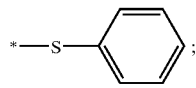

$R^{14}$ denotes —(CH$_2$)$_n$—CH$_3$, —(CF$_2$)$_n$—CF$_3$, and also

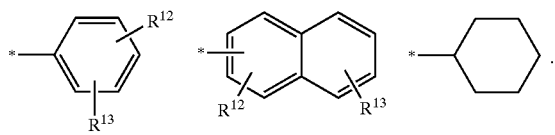

Solvents that are particularly suitable for the formulations are γ-butyrolactone, N-methylpyrrolidone, dioxane, butanone, cyclohexanone, cyclopentanone, methoxypropyl acetate, ethyl lactate, and dimethyl sulfoxide.

The concentration of the polymer in the solvent is preferably from 5 to 40% by weight, that of the photoacid and of the sensitizer from 0.05 to 5% by weight, and the concentration of the dissolution inhibitor is from 1 to 10% by weight.

Examples of suitable sensitizers include the following: pyrene, thioxanthone, fluorene, fluorenone, anthra-quinone, benzil, 1,2-benzanthracene, xanthone, pheno-thiazine, benzophenone, anthracene, Michler's ketone, or perylene, which may be present in substituted or unsubstituted form.

Suitable adhesion promoters and/or surface-active substances are silanes, especially those containing at least one alkoxy group and, where appropriate, an amino, epoxy, acrylic, allyl, vinyl, methacrylic, thiol or hydroxyl. group. The remaining groups may be alkyl groups. Examples: allyltrimethylsilane, 3-aminopropyl-trimethoxysilane, trimethoxy (3-methacryloyloxypropyl)-silane, 3-glycidyloxypropyltrilflethoxysilane, trimethoxy-vinylsilane, etc.

Examples of suitable photobases are the following:

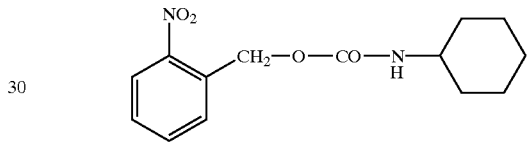

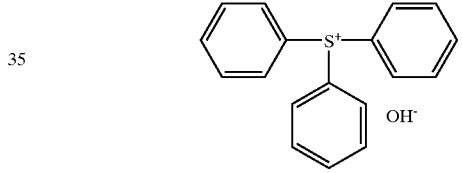

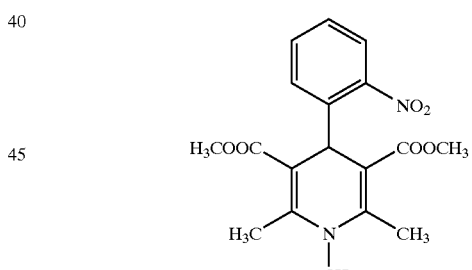

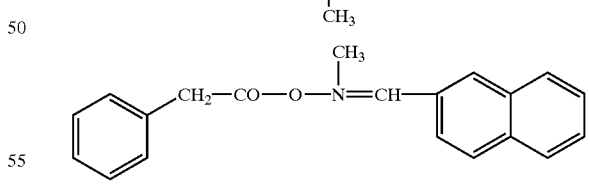

Particularly suitable dissolution inhibitors are the following: homopolymers and copolymers with tert-butyl acrylate, homopolymers and copolymers with tert-butyl methacrylate, homopolymers and copolymers with tert-butoxycarbonyloxystyrene (t-BOC vinylphenol), homopolymers and copolymers with tert-butylcinnamic acid, acetals, ketals, homo- and copolyacetals and -polyketals, and also homo- and copolycarbonates. Additionally:

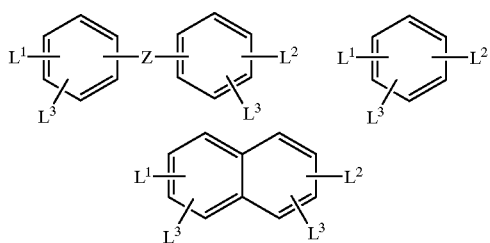

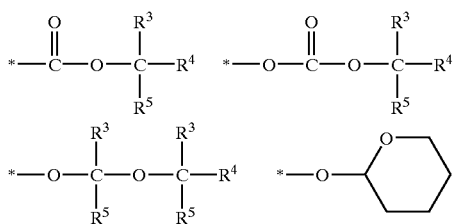

Z here is as defined above;

$L^1$ and $L^2$, independently of one another, are —H; and also

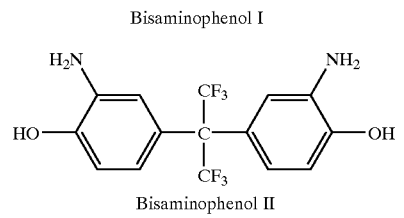

where $R^3$, $R^4$ and $R^5$ can be:

—H, —F, —$(CH_2)_n$—$CH_3$, —$(CF_2)_n$—$CF_3$, in which at least one radical of $R^3$, $R^4$, and $R^5$ is other than hydrogen. Particular preference is given to using tert-butoxycarbonyl groups, in which the radicals $R^3$, $R^4$, and $R^5$ are formed by —$(CH_2)_n$—$CH_3$, especially —$CH_3$, where n=0 to 10;

$L^3$ is selected from the following substituents: —H, —CN, —OH, —COOH, —Cl, —F, —$C(CH_3)_3$, —$C(CF_3)_3$, —$(CH_2)_n$—$CH_3$, —$(CF_2)_n$—$CF_3$, —O—$(CH_2)_n$—$CH_3$, —O—$(CF_2)_n$—$CF_3$, —C≡CH, —CH=$CH_2$, —O—CH=$CH_2$, —O—$CH_2$—CH=$CH_2$, —CO—$(CH_2)_n$—$CH_3$, —CO—$(CF_2)_n$—$CF_3$, —CO—CH=CH—COOH, where n=0 to 10.

The dissolution inhibitors may be in monomeric and/or polymeric form, and at least some of their hydroxyl and/or carboxyl functions may be blocked with acid-eliminable protective groups.

The invention is illustrated below with reference to examples. The dielectric constants of the films according to the invention are compared with those obtained in accordance with the prior art, in particular in accordance with European Patent No. EP 0 264 678 B1. It was possible to show that the addition of a photoactive component very decisively influences the level of the dielectric constant, which is why the dielectric constants of the existing films are always higher than those of the films according to the invention.

Although the invention is described herein as embodied in a photosensitive formulation for buffer coatings, a film containing the photosensitive formulation, and a method for fabricating electronics with the photosensitive formulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying examples.

DESCRIPTION OF THE PREFERRED EMBODIMENTS

The bisaminophenols used here are chosen from the following:

Bisaminophenol I

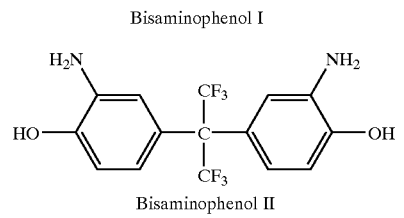

Bisaminophenol II

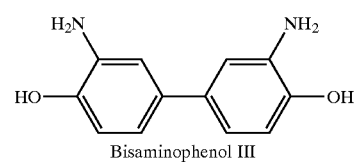

Bisaminophenol III

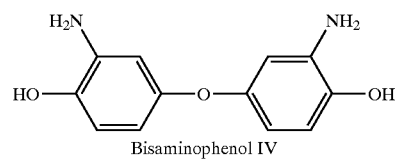

Bisaminophenol IV

Bisaminophenol V

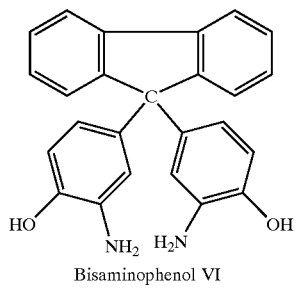

Bisaminophenol VI

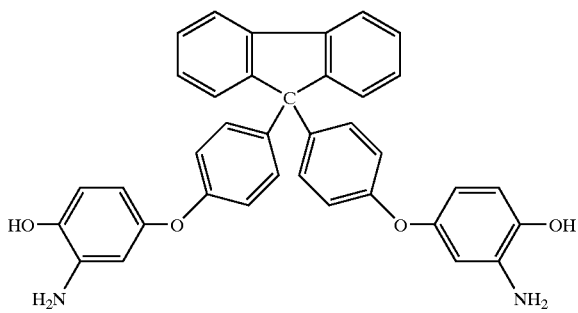

The dicarbonyl dichlorides used are chosen from the following:

Isophthaloyl dichloride

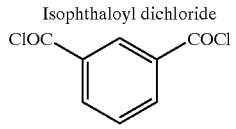

-continued

Diphenyl ether 4,4'-dicarbonyl dichloride

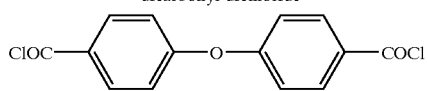

2,2'-Bis(4,4'-chlorocarboxyphenyl)hexafluoropropane

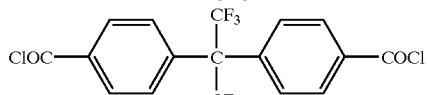

4,4'-Chlorocarboxybiphenyl

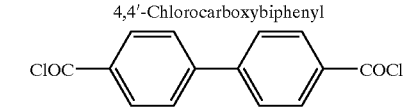

Naphthalene-2,6-dicarbonyl dichloride

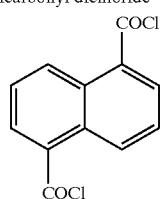

The monomer dissolution inhibitors used are selected from the following:

Dissolution inhibitor I

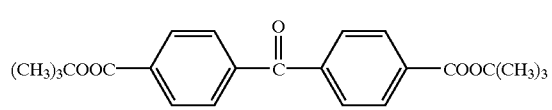

Dissolution inhibitor II

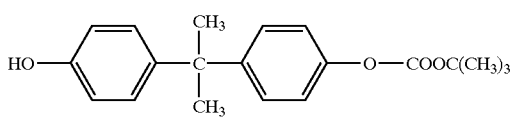

Dissolution inhibitor III

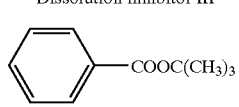

The photoacids used are chosen from the following:

Photoacid I

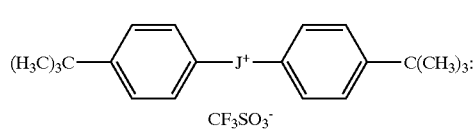

Photoacid II

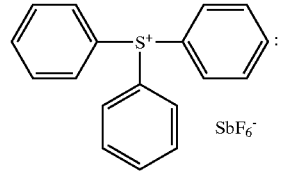

Photoacid III

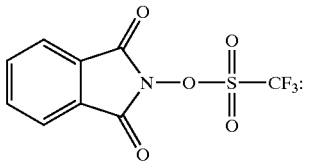

Photoacid IV

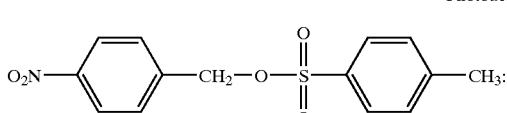

Photoacid V

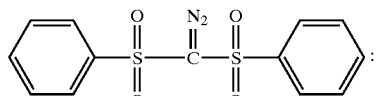

Photoacid VI

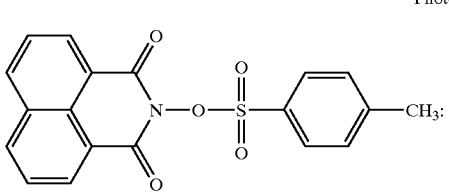

Photoacid VII

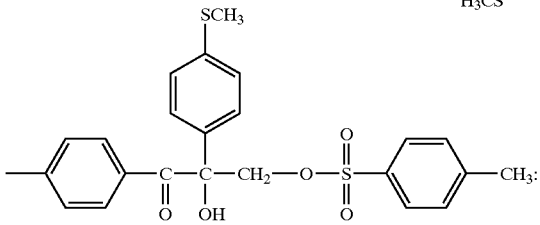

EXAMPLE 1 a) Preparation of a Polybenzoxazole Precursor 18.3 g (0.05 mol) of bisaminophenol I are dissolved in 250 ml of distilled N-methylpyrrolidone (NMP). Added dropwise to this solution at 10° C. and with stirring is a solution of 8.1 g (0.04 mol) of isophthaloyl dichloride in 80 ml of γ-butyrolactone and the reaction solution is stirred at room temperature for 16 hours. Thereafter, 3.1 g (0.02 mol) of norbornenecarbonyl dichloride in 30 ml of γ-butyrolactone are added dropwise to this solution in order to block the end groups, and the solution is then stirred for 3 hours. Then 9.5 g (0.12 mol) of pyridine in solution of 50 ml of γ-butyrolactone is added slowly dropwise to the reaction solution at room temperature and the reaction solution is stirred at room temperature for a further 2 hours. The resulting polymer is precipitated by adding the reaction solution dropwise to a mixture of isopropanol and water (3:1), washed three times with fresh precipitant, and dried in a vacuum oven at 50° C./10 mbar for 72 hours.

b) Photosensitive Formulation and Photostructuring 3 g of the poly-o-hydroxyamide obtained under (a) are dissolved together with 0.6 g of dissolution inhibitor I and also 0.1 g of photoacid I and 0.1 g of 1,2-benzanthracene as sensitizer in 8 g of cyclopentanone and the solution is subjected to pressure filtration and transferred to a plastic syringe, and the syringe is provided with a preliminary filter.

This resist solution is applied using the syringe to a cleaned and dried silicon wafer and is spun in a spin coater. The resist film is first dried on a hotplate at 90° C. for 120 seconds. The coat thickness is 4 μm. Thereafter the resist film is subjected to contact exposure through a mask in an exposure apparatus, using a 365 nm filter at the same time. Subsequently, the silicon wafer is placed on the hotplate at 120° C. again for 120 seconds. Following development with the developer NMD-W (Tokyo Ohka, 1:1 dilution with water), structures (features) having a resolution of 2 μm are obtained. The exposure dose is 120 mJ/cm². Heat treatment of the structured film on the substrate in a regulated oven at 350° C. produces resist structures which are stable at high temperature.

c) Photosensitive Comparative Formulation

The same formulation as described under (b) is prepared again with the difference that in this case the combination of dissolution inhibitor, photoacid, and sensitizer is replaced by just 0.8 g of photoactive component corresponding to European Patent No. EP 264678. All other conditions are identical. The dose required for the same structuring is 250 mJ/cm².

The photoactive component used for comparison is a mixed tris ester of trihydroxybenzophenone and the naphthoquinone-4-sulfonic acid of the structure

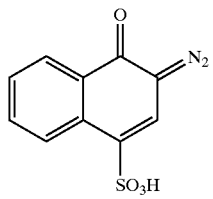

d) Determination of the Dielectric Constants

For the following experiment, the substrate used is a silicon wafer that has been (sputter) coated with titanium nitride. The formulations obtained under (a) and (b), along with a formulation containing only the poly-o-hydroxyamide obtained under (a), are each applied to a substrate and spun in a spin coater for 20 seconds. The film is then dried by placing the coated substrate on a hotplate at 100° C. for 1 minute. After drying, the film is heat treated (baked) in order to convert the polymer to polybenzoxazole. For this purpose the coated substrate is introduced into a regulatable oven and the oven is heated to 330° C. (heating rate 3° C./min under nitrogen). After one hour at 350° C., the oven is switched off and the coated substrate is allowed to cool and then removed.

The dielectric constant of the pure polymer film, determined by the capacitive method, is 2.85 following heat treatment.

The dielectric constant of the photosensitive film (b) of the invention is 2.75 after heat treatment.

The dielectric constant of the photosensitive film (c) containing the tris ester as photoactive component is 2.95 following heat treatment.

EXAMPLE 2 a) Preparation of a Polybenzoxazole Precursor 10.8 g (0.05 mol) of bisaminophenol II are dissolved in 250 ml of distilled N-methylpyrrolidone (NMP). Added dropwise to this solution at 10° C. and with stirring is a solution of 11.8 g (0.04 mol) of diphenyl ether 4,4'-dicarbonyl dichloride in 80 ml of γ-butyrolactone and the reaction solution is stirred at room temperature for 16 hours. Thereafter, 2.1 g (0.02 mol) of methacryloyl chloride in 30 ml of γ-butyrolactone are added dropwise to this solution in order to block the end groups, and the solution is then stirred for 3 hours. Then 9.5 g (0.12 mol) of pyridine in solution of 50 ml of γ-butyrolactone are added slowly dropwise to the reaction solution at room temperature and the reaction solution is stirred at room temperature for a further 2 hours. The resulting polymer is precipitated by adding the reaction solution dropwise to a mixture of isopropanol and water (3:1), washed three times with fresh precipitant, and dried in a vacuum oven at 50° C./10 mbar for 72 hours.

b) Photosensitive Formulation and Photostructuring

The photosensitive formulation is made in exactly the same way as in Example 1 (b) except that here 0.6 g of a 1:1 mixture of dissolution inhibitor II and dissolution inhibitor III and also 0.1 g of photoacid II and 0.1 g of anthracene as sensitizer are used. Following exposure without filters, a resolution of 2 μm is obtained. The exposure dose, measured at 365 nm, is 90 mJ/cm².

c) Photosensitive Comparative Formulation

As described in example 1, a comparative formulation is prepared with the above-described tris ester as photoactive component, using as poly-o-hydroxyphenol-amide the polybenzoxazole precursor obtained in example 2 above. All other conditions are identical. The dose required for the same structuring is 190 mJ/cm².

d) Determination of the Dielectric Constants

The dielectric constant was determined in analogy to example 1 (d).

The dielectric constant of the pure polymer film is 3.1 after heat treatment.

The dielectric constant of the photosensitive film (b) of the invention is 2.95 after heat treatment.

The dielectric constant of the photosensitive film (c) containing the tris ester photoactive component is 3.2 following heat treatment.

EXAMPLE 3 a) Preparation of a Polybenzoxazole Precursor 2.8 g (0.02 mol) of bisaminophenol IV and 11.3 g (0.02 mol) of bisaminophenol VI are dissolved in 250 ml of distilled N-methylpyrrolidone (NMP). Added dropwise to this solution at 10° C. and with stirring is a solution of 4.1 g (0.02 mol) of isophthaloyl dichloride and 5.6 g (0.02 mol) of 4,4'-chlorocarboxydiphenyl in 100 ml of γ-butyrolactone and the reaction solution is stirred at room temperature for 16 hours. Then, 7.9 g (0.1 mol) of pyridine in solution of 50 ml of γ-butyrolactone are added slowly dropwise to the reaction solution at room temperature and the reaction solution is stirred at room temperature for a further 2 hours. The resulting polymer is precipitated by adding the reaction solution dropwise to a mixture of isopropanol and water (3:1), washed three times with fresh precipitant, and dried in a vacuum oven at 50° C./10 mbar for 72 hours.

b) Photosensitive Formulation and Photostructuring

The photosensitive formulation is made in exactly the same way as in example 1 except that here 0.6 g of a copolymer of tert-butyl methacrylate and methacrylic acid as disdissolution inhibitor and also 0.1 g of a 1:1 mixture of photoacid III and photoacid IV and also 0.1 g of perylene as sensitizer are used. Following exposure without filters, a resolution of 1.8 µm is obtained. The exposure dose, measured at 365 nm, is 80 mJ/cm$^2$.

c) Photosensitive Comparative Formulation

As described in Example 1 (c), a comparative formulation is prepared with the tris ester described in example 1 (c) as photoactive component, using as poly-o-hydroxyphenolamide the polybenzoxazole precursor obtained under (a). The dose required for the same structuring is 210 mJ/cm$^2$.

d) Determination of the Dielectric Constants

The dielectric constant was determined in analogy to Example 1 (d).

The dielectric constant of the pure polymer film is 3.1 after heat treatment.

The dielectric constant of the photosensitive film (b) of the invention is 3.0 after heat treatment.

The dielectric constant of the photosensitive film (c) containing the tris ester photoactive component is 3.2 following heat treatment.

EXAMPLE 4 a) Preparation of a Polybenzoxazole Precursor 9.2 g (0.025 mol) of bisaminophenol I and 5.8 g (0.025 mol) of bisaminophenol III are dissolved in 250 ml of distilled N-methylpyrrolidone (NMP). Added dropwise to this solution at 10° C. and with stirring is a solution of 10.1 g (0.04 mol) of naphthalene-2,6-dicarbonyl dichloride in 80 ml of γ-butyrolactone and the reaction solution is stirred at room temperature for 16 hours. Thereafter, 2 g (0.02 mol) of maleic anhydride in 30 ml of γ-butyrolactone are added dropwise to this solution in order to block the end groups and the solution is stirred for a further 3 hours. Then 11.8 g (0.12 mol) of triethylamine in solution of 50 ml of γ-butyrolactone are added slowly dropwise to the reaction solution at room temperature and the reaction solution is stirred at room temperature for a further 2 hours. The resulting polymer is precipitated by adding the reaction solution dropwise to a mixture of isopropanol and water (3:1), washed three times with fresh precipitant, and dried in a vacuum oven at 50° C./10 mbar for 72 hours.

b) Photosensitive Formulation and Photostructuring

The photosensitive formulation is made in exactly the same way as in example 1 (b) except that here 0.6 g of p-tert-butoxycarbonyloxystyrene as the dissolution inhibitor and also 0.2 g of a 1:1 mixture of photoacid VI and photoacid VII are used. Following exposure without filters, a resolution of 1.8 µm is obtained. The exposure dose, measured at 365 nm, is 90 mJ/cm$^2$.

c) Photosensitive Comparative Formulation

As described in example 1 (c), a comparative formulation is prepared with the tris ester described in example 1 (c) as photoactive component, using as poly-o-hydroxyphenolamide the polybenzoxazole precursor obtained in example 4 above. The dose required for the same structuring is 200 mJ/cm$^2$.

d) Determination of the Dielectric Constants

The dielectric constant was determined in analogy to example 1 (d).

The dielectric constant of the pure polymer film is 3.05 after heat treatment.

The dielectric constant of the photosensitive film (b) of the invention is 3.0 after heat treatment.

The dielectric constant of the photosensitive film (c) containing the tris ester photoactive component is 3.15 following heat treatment.

EXAMPLE 5 a) Preparation of a Polybenzoxazole Precursor 19 g (0.5 mol) of bisaminophenol V are dissolved in 250 ml of distilled N-methylpyrrolidone (NMP). Added dropwise to this solution at 10° C. and with stirring is a solution of 8.6 g (0.02 mol) of 2,2'-bis(4,4'-chlorocarboxyphenyl)hexafluoropropane and 4.1 g (0.02 mol) of isophthaloyl dichloride in 100 ml of γ-butyrolactone and the reaction solution is stirred at room temperature for 16 hours. Thereafter, 2.8 g (0.02 mol) of benzoyl chloride in 30 ml of γ-butyrolactone are added dropwise to this solution in order to block the end groups and the solution is stirred for a further 3 hours. Then 11.8 g (0.12 mol) of triethylamine in solution of 50 ml of γ-butyrolactone are added slowly dropwise to the reaction solution at room temperature and the reaction solution is stirred at room temperature for a further 2 hours. The resulting polymer is precipitated by adding the reaction solution dropwise to a mixture of isopropanol and water (3:1), washed three times with fresh precipitant, and dried in a vacuum oven at 50° C./10 mbar for 72 hours.

b) Photosensitive Formulation and Photostructuring

The photosensitive formulation is made in exactly the same way as in Example 1 (b) except that here 0.6 g of a copolyacetal(polyvinyl butyral-co-vinyl alcohol-co-vinyl acetate containing 80% by weight vinyl butyral) as dissolution inhibitor and also 0.2 g of photoacid V are used. Following exposure at 365 nm, a resolution of 1.8 µm is obtained. The exposure dose, measured at 365 nm, is 85 mJ/cm$^2$.

c) Photosensitive Comparative Formulation

As described in example 1 (c), a comparative formulation is prepared with the tris ester described in example 1 (c) as photoactive component, using as poly-o-hydroxyphenolamide the polybenzoxazole precursor obtained under (a). The dose required for the same structuring is 220 mJ/cm$^2$.

d) Determination of the Dielectric Constants

The dielectric constant was determined in analogy to Example 1 (d).

The dielectric constant of the pure polymer film is 2.8 after heat treatment.

The dielectric constant of the photosensitive film (b) of the invention is 2.7 after heat treatment.

The dielectric constant of the photosensitive film (c) containing the tris ester photoactive component is 2.9 following heat treatment.

Other features which are considered as characteristic for the invention are set forth in the appended claims.

I claim:

1. A photosensitive formulation comprising:
   a poly-o-hydroxyamide containing free hydroxyl groups;
   a dissolution inhibitor containing polar groups blocked with acid-labile groups, said dissolution inhibitor being insoluble in polar solvents before said acid-labile groups have been eliminated and being soluble in polar solvents after said acid-labile groups have been liberated;
   a photoacid; and
   a solvent.

2. The photosensitive formulation as claimed in claim 1, wherein said poly-o-hydroxyamide has a formula

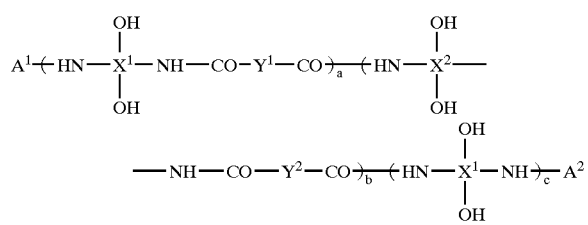

where

A$^1$ and A$^2$ are substituents selected from the group consisting of:
—H, —CO—(CH$_2$)$_n$—CH$_3$, —CO—(CF$_2$)$_n$—CF$_3$, —CO—CH=CH—COOH, where n=0 to 10;

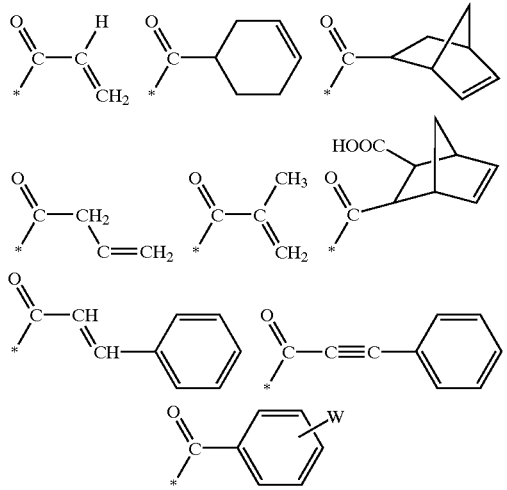

where W is a substituent selected from the group consisting of —H, —F, —CN, —C(CH$_3$)$_3$, —(CH$_2$)$_n$—CH$_3$, —(CF$_2$)$_n$—CF$_3$, —O—(CH$_2$)$_n$—CH$_3$, —O—(CF$_2$)$_n$—CF$_3$, —CH=CH$_2$, —C≡CH, and

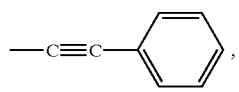

where n=0 to 10; and
if A$^2$ is attached to at least one of —CO— and C=O, A$^2$ is an OH group;

X$^1$ and X$^2$, independently of one another, are substituents selected from the group consisting of:

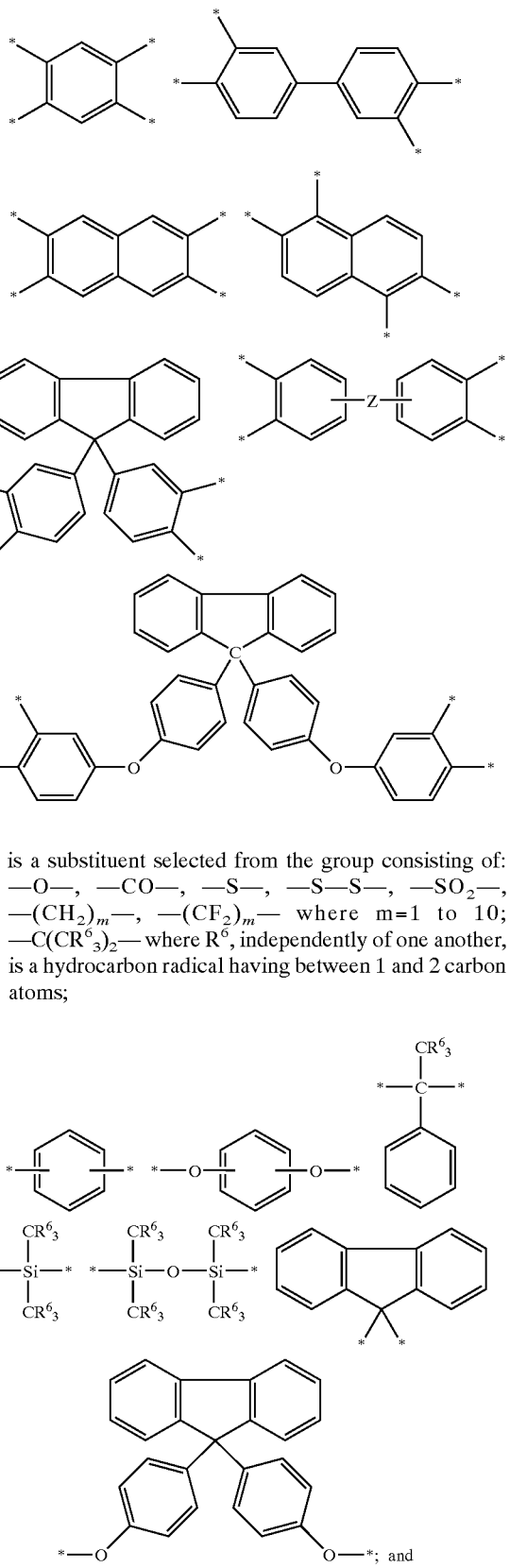

Z is a substituent selected from the group consisting of: —O—, —CO—, —S—, —S—S—, —SO$_2$—, —(CH$_2$)$_m$—, —(CF$_2$)$_m$— where m=1 to 10; —C(CR$^6$$_3$)$_2$— where R$^6$, independently of one another, is a hydrocarbon radical having between 1 and 2 carbon atoms;

Y$^1$ and Y$^2$, independently of one another, are substituents selected from the group consisting of:

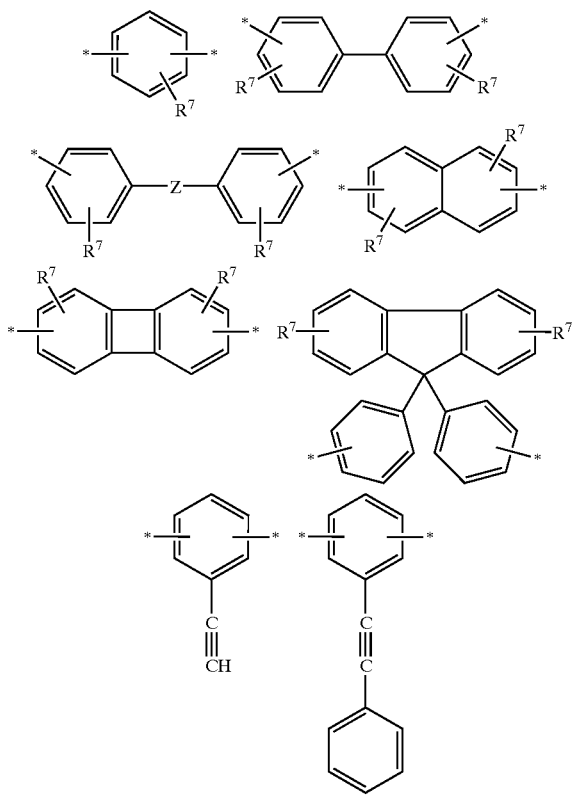

where R[7] is a substituent selected from the group consisting of —H, —CN, —C(CH$_3$)$_3$, —C(CF$_3$)$_3$, —(CH$_2$)$_n$—CH$_3$, —(CF$_2$)$_n$—CF$_3$, —O—(CH$_2$)$_n$—CH$_3$, —O—(CF$_2$)$_n$—CF$_3$, —C≡CH, —CH=CH$_2$, —O—CH=CH$_2$, —O—CH$_2$—CH=CH$_2$, —CO—(CH$_2$)$_n$—CH$_3$, —CO—(CF$_2$)$_n$—CF$_3$, where n=0 to 10; and Z is a substituent selected from the group consisting of: —O—, —CO—, —S—, —S—S—, —SO$_2$—, —(CH$_2$)$_m$—, —(CF$_2$)$_m$— where m=1 to 10; —C(CR$^6$$_3$)$_2$— where R$^6$, independently of one another, is a hydrocarbon radical having between 1 and 2 carbon atoms;

a is an integer from 1 to 100; b is an integer from 0 to 100; and c is an integer from 0 to 1.

3. The photosensitive formulation according to claim 2, wherein A$^1$ and A$^2$ are identical.

4. The photosensitive formulation according to claim 2, wherein A$^1$ and A$^2$ are different.

5. The photosensitive formulation according to claim 2, wherein R$^6$ includes substituents selected from the group consisting of fluorine, hydrogen, a halide, and a pseudohalide.

6. The formulation according to claim 1, further comprising additives selected from the group consisting of a sensitizer, a photobase, an adhesion promoter, a defoamer, and a surface-active substance.

7. The formulation according to claim 1, wherein:
a concentration of said poly-o-hydroxyamide in said solvent is between 5 and 40% by weight;
a concentration of at least one of said photoacid and said sensitizer is between 0.05 and 5% by weight; and
a concentration of said dissolution inhibitor is between 1 and 10% by weight.

8. The formulation according to claim 1, wherein:
said dissolution inhibitor is in monomeric form; and
said polar groups are selected from the group consisting of hydroxyl and carboxyl groups, said polar groups being blocked with said acid-labile groups.

9. The formulation according to claim 1, wherein:
said dissolution inhibitor is in polymeric form; and
said polar groups are selected from the group consisting of hydroxyl and carboxyl groups, said polar groups being blocked with said acid-labile groups.

10. The photosensitive formulation according to claim 1, wherein said dissolution inhibitor is selected from the group consisting of homopolymers and copolymers with tert-butyl acrylate, homopolymers and copolymers with tert-butyl methacrylate, homopolymers and copolymers with tert-butoxycarbonyloxystyrene, homopolymers and copolymers with tert-butylcinnamic acid, acetals, ketals, homoacetals, copolyacetals, polyketals, homopolycarbonates, copolycarbonates, and additionally:

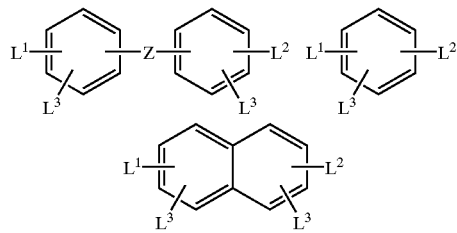

where Z is a substituent selected from the group consisting of: —O—, —CO—, —S—, —S—S—, —SO$_2$—, —(CH$_2$)$_m$—, —(CF$_2$)$_m$— where m=1 to 10; —C(CR$^6$$_3$)$_2$— where R$^6$, independently of one another, is a hydrocarbon radical having between 1 and 2 carbon atoms;

L$^1$ and L$^2$, independently of one another, are substituents selected from the group consisting of —H and

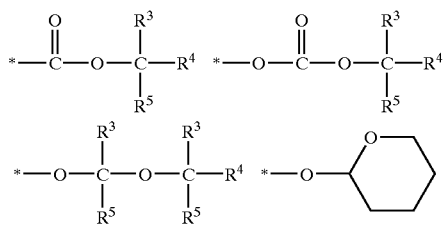

where R$^3$, R$^4$, and R$^5$ are substituents selected from the group consisting of —H, —F, —(CH$_2$)$_n$—CH$_3$, —(CF$_2$)$_n$—CF$_3$, where at least one radical of R$^3$, R$^4$, and R$^5$ is other than hydrogen, particular preference being given to tert-butoxy-carbonyl groups in which the radicals R$^3$, R$^4$, and R$^5$ are formed by —(CH$_2$)$_n$—CH$_3$, especially —CH$_3$, where n=0 to 10;

L$^3$ is a substituent selected from the group consisting of —H, —CN, —OH, —COOH, —Cl, —F, —C(CH$_3$)$_3$, —C(CF$_3$)$_3$, —(CH$_2$)$_n$—CH$_3$, —(CF$_2$)$_n$—CF$_3$, —O—(CH$_2$)$_n$—CH$_3$, —O—(CF$_2$)$_n$—CF$_3$, —C≡CH, —CH=CH$_2$, and —O—CH=CH$_2$, —O—CH$_2$—CH=CH$_2$, —CO—(CH$_2$)$_n$—CH$_3$, —CO—(CF$_2$)$_n$—CF$_3$, —CO—CH=CH—COOH, where n=0 to 10.

11. The photosensitive formulation according to claim 2, wherein R$^6$ includes substituents selected from the group consisting of fluorine, hydrogen, a halide, and a pseudohalide.

12. A film, comprising a photosensitive formulation including:
- a poly-o-hydroxyamide containing free hydroxyl groups;
- a dissolution inhibitor containing polar groups blocked with acid-labile groups, said dissolution inhibitor being insoluble in polar solvents before said acid-labile groups have been eliminated and being soluble in polar solvents after said acid-labile groups have been liberated;
- a photoacid; and
- a solvent.

13. The film according to claim 12, wherein said solvent has been evaporated.

14. A method for forming microelectronics, which comprises applying to a wafer a photosensitive formulation including:
- a poly-o-hydroxyamide containing free hydroxyl groups;
- a dissolution inhibitor containing polar groups blocked with acid-labile groups, said dissolution inhibitor being insoluble in polar solvents before said acid-labile groups have been eliminated and being soluble in polar solvents after said acid-labile groups have been liberated;
- a photoacid; and
- a solvent.

15. The method according to claim 14, which further comprises evaporating the solvent to form a film on the wafer.

16. The method according to claim 15, which further comprises at least partly exposing the film with light to activate the photoacid.

17. The method according to claim 16, which further comprises liberating the acid-labile groups with the activated photoacid.

18. The method according to claim 17, which further comprises dissolving the exposed film with a polar solvent.

* * * * *